(12) United States Patent
Zhang et al.

(10) Patent No.: US 10,601,422 B2
(45) Date of Patent: Mar. 24, 2020

(54) INTEGRATED HIGH-SIDE DRIVER FOR P-N BIMODAL POWER DEVICE

(71) Applicant: Texas Instruments Incorporated, Dallas, TX (US)

(72) Inventors: Yongxi Zhang, Plano, TX (US); Sameer P. Pendharkar, Allen, TX (US); Philip L. Hower, Concord, MA (US); Salvatore Giombanco, Cassaro (IT); Filippo Marino, Tremestieri Etneo (IT); Seetharaman Sridhar, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/809,291

(22) Filed: Nov. 10, 2017

(65) Prior Publication Data

US 2018/0097517 A1 Apr. 5, 2018

Related U.S. Application Data

(62) Division of application No. 15/067,928, filed on Mar. 11, 2016, now Pat. No. 9,843,322.

(51) Int. Cl.

| | |
|---|---|
| *H03K 17/687* | (2006.01) |
| *H01L 29/06* | (2006.01) |
| *H03K 19/0185* | (2006.01) |
| *H01L 29/78* | (2006.01) |
| *H01L 29/10* | (2006.01) |
| *H03K 17/12* | (2006.01) |

(Continued)

(52) U.S. Cl.
CPC ... *H03K 19/018521* (2013.01); *H01L 27/092* (2013.01); *H01L 29/0634* (2013.01); *H01L 29/0696* (2013.01); *H01L 29/1033* (2013.01); *H01L 29/7831* (2013.01); *H01L 29/7835* (2013.01); *H03K 17/122* (2013.01); *H01L 21/823807* (2013.01); *H01L 21/823814* (2013.01)

(58) Field of Classification Search
CPC .......... H03K 19/018521; H03K 17/122; H01L 27/092; H01L 29/0634; H01L 29/0696; H01L 29/1033; H01L 29/7816; H01L 29/7831; H01L 21/823807; H01L 21/823814
USPC .................. 327/306, 333; 326/61–62, 80–81
See application file for complete search history.

(56) References Cited

U.S. PATENT DOCUMENTS

| | | |
|---|---|---|
| 4,947,192 A | 8/1990 | Hawkins et al. |
| 5,156,989 A | 10/1992 | Williams et al. |

(Continued)

OTHER PUBLICATIONS

PCT Search Report, dated Jun. 8, 2017, PCT/US2017/022183.

(Continued)

*Primary Examiner* — Dinh T Le
(74) *Attorney, Agent, or Firm* — Lawrence J. Bassuk; Charles A. Brill; Frank D. Cimino

(57) ABSTRACT

An integrated circuit chip includes a bimodal power N-P-Laterally Diffused Metal Oxide Semiconductor (LDMOS) device having an N-gate coupled to receive an input signal and a level shifter coupled to receive the input signal and to provide a control signal to a P-gate driver of the N-P-LDMOS device. A method of operating an N-P-LDMOS power device is also disclosed.

15 Claims, 4 Drawing Sheets

(51) Int. Cl.
*H01L 27/092* (2006.01)
*H01L 21/8238* (2006.01)

(56) References Cited

U.S. PATENT DOCUMENTS

| | | | | |
|---|---|---|---|---|
| 7,163,856 | B2* | 1/2007 | You | H01L 21/823814 |
| | | | | 257/E21.417 |
| 7,745,883 | B2 | 6/2010 | Williams et al. | |
| 8,354,873 | B2* | 1/2013 | Ono | H03K 17/164 |
| | | | | 327/333 |
| 8,786,371 | B2* | 7/2014 | Popplewell | H03F 1/0227 |
| | | | | 330/297 |
| 9,299,691 | B2 | 3/2016 | Lotfi et al. | |
| 9,362,388 | B1 | 6/2016 | Zuniga et al. | |
| 9,413,375 | B2* | 8/2016 | Jiang | H04B 1/0003 |
| 9,673,707 | B2* | 6/2017 | Popplewell | H03F 1/0227 |
| 9,843,322 | B2* | 12/2017 | Zhang | H01L 29/0634 |
| 2005/0102128 | A1* | 5/2005 | Wilhelm | H03K 17/063 |
| | | | | 703/23 |
| 2006/0038225 | A1 | 2/2006 | Lotfi et al. | |
| 2010/0252883 | A1 | 10/2010 | Chen | |
| 2013/0015523 | A1 | 1/2013 | You | |

OTHER PUBLICATIONS

Zhang, et al., "A RESURF P-N Bimodal LDMOS Suitable for High Voltage Power Switching Applications", Proceedings of the 27th International Symposium on Power Semiconductor Devices & IC's, p. 61-64, May 10-14, 2015, Kowloon Shangri-La, Hong Kong.

European Patent Office Search Report, dated Jul. 11, 2019, PCT/US2017022183.

Moufu Kong et al., "Study on Dual Channel n-p-LDMOS Power Devices with Three Terminals", IEEE Transactions on Electron Devices, IEEE Service Center, Piscataway, NJ, US, vol. 60, No. 10, Oct. 2013, pp. 3508-3514.

European Patent Office Search Report, dated Feb. 25, 2019, Reference TI-76256 EP, PCT/US2017022183.

\* cited by examiner

INTEGRATED HIGH-SIDE DRIVER FOR P-N BIMODAL POWER DEVICE

CROSS REFERENCE TO RELATED APPLICATIONS

This application is a divisional of U.S. Nonprovisional patent application Ser. No. 15/067,928, filed Mar. 11, 2016, now U.S Pat. No. 9,843,322, issued Dec. 12, 2017, the contents of which is herein incorporated by reference in its entirety.

FIELD OF THE DISCLOSURE

Disclosed embodiments relate generally to the field of power devices. More particularly, and not by way of any limitation, the present disclosure is directed to an integrated high-side driver for a P-N bimodal power device.

BACKGROUND

Lateral double-diffused metal-oxide-semiconductor (LD-MOS) devices are widely used in power management, smart power integrated circuits for their convenient integration. Bimodal conduction N-P-LDMOS are four-terminal devices having both an N-LDMOS and a P-LDMOS integrated together. Accordingly, these devices have two gates for P- and N-type channels, necessitating two control signals. In these power devices, the N-LDMOS requires a low voltage signal, while the P-LDMOS requires a high-voltage signal. This four-terminal device with its requirement for two separate signals cannot be used as conveniently as a conventional three-terminal power device. Additionally, the complexity of the double gates driver circuit can heavily impact the benefits of a bimodal N-P-LDMOS, even to the point of negating those benefits.

SUMMARY

The proposed solution implements an internal level shifter that receives the low voltage input signal sent to the N-LDMOS driver and provides a high-voltage signal to the P-LDMOS driver. The P-LDMOS driver in turn generates the control signal for the P-gate, whose reference node is the high voltage drain terminal. The internal level shifter and the P-LDMOS driver are integrated into the chip on which the N-P-LDMOS is implemented, where they may provide space savings and/or shorter, faster connections.

In one aspect, an embodiment of an integrated circuit (IC) chip is disclosed. The IC chip includes a bimodal power N-P-Laterally Diffused Metal Oxide Semiconductor (LDMOS) device, an N-gate of the N-P-LDMOS device coupled to receive an input signal; and a level shifter coupled to receive the input signal and to provide a control signal to a P-gate driver of the N-P-LDMOS device.

In another aspect, an embodiment of an N-P-Lateral Double-Diffused Metal-Oxide-Semiconductor (LDMOS) device and control circuit formed on a single chip is disclosed. The N-P-LDMOS device and control circuit include a source and an N-gate for the N-P-LDMOS device that form an outer loop comprising first fingers, the first fingers extending inward from the outer loop, and a first gap between first and second ends of the outer loop, the first gap being positioned opposite the first fingers; a drain and a P-gate for the N-P-LDMOS device that form an inner loop that is enclosed within the outer loop, the inner loop comprising second fingers that extend outward from the inner loop to form conduction channels between the second fingers of the inner loop and the first fingers of the outer loop, the inner loop further comprising a second gap between first and second ends of the inner loop, the second gap being positioned opposite the second fingers; and an N-LDMOS transistor comprising a source and an N-gate located in the first gap and a drain located in the second gap, wherein the drain of the N-LDMOS transistor is coupled to a P-gate pad of the N-P-LDMOS device that is located within the inner loop, a gate of the N-LDMOS transistor is coupled to receive a signal input to control the N-gate of the N-P-LDMOS device and a source of the N-LDMOS transistor is coupled to one of a lower rail and a negative voltage.

In yet another aspect, an embodiment of an N-P-Lateral Double-Diffused Metal-Oxide-Semiconductor (LDMOS) device and control circuit formed on a single chip is disclosed. The N-P-LDMOS device and control circuit includes a bottom n-type region formed on a p-type substrate; a top n-type region overlying the bottom n-type region, a portion of the bottom n-type region and the top n-type region being separated by a buried p-type region; a second p-type region partially overlying the top n-type region; an n-type well that is formed adjacent a first end of the second p-type region and the top n-type region, the n-type well containing a first heavily-doped n-type region and a first heavily doped p-type region, the first heavily doped n-type region and the first heavily-doped p-type region being coupled to a drain electrode of the N-P-LDMOS device; a p-type well that is formed adjacent a second end of the second p-type region and the top n-type region, the p-type well containing a second heavily-doped n-type region and a second heavily doped p-type region, the second heavily doped n-type region and the second heavily-doped p-type region being coupled to a source electrode of the N-P-LDMOS device; a p-gate overlying a portion of the first heavily-doped p-type region, the n-type well and a portion of the second p-type region; and an n-gate overlying a portion of the second heavily-doped n-type region, the p-type well and a portion of the second p-type region; wherein the drain electrode is coupled to a drain of an N-LDMOS transistor, the N-LDMOS transistor comprising a gate coupled to receive a signal that controls an n-gate of the N-P-LDMOS device and a source coupled to one of a lower rail and a negative voltage.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. As used herein, the term "couple" or "coupled" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

Figure 5A:
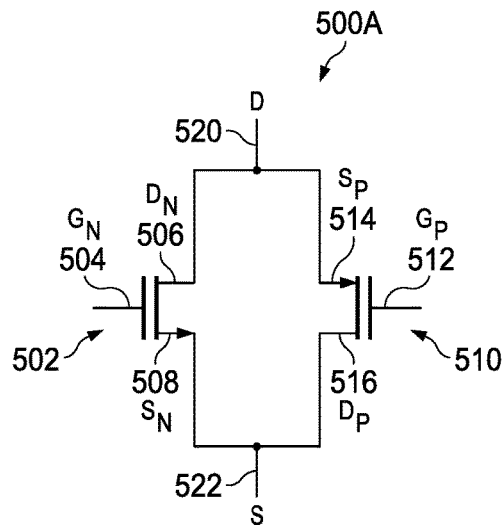
FIG. 5A depicts a schematic of an N-P-LDMOS circuit for which the disclosed control circuit is designed.

Turning first to FIG. 5A, a schematic circuit diagram of a dual-gate bimodal conduction N-P-LDMOS Power Transistor 500A is shown. The LDMOS power transistor comprises an n-type LDMOS transistor having a p-type transistor embedded therein. The n-type transistor of the LDMOS power transistor may at times be referred to herein as an NMOS device. Similarly, the p-type transistor of the LDMOS power transistor may at times be referred to herein as a PMOS device. Dual-gate N-P-LDMOS Transistor 500A comprises N-LDMOS Transistor 502 and P-LDMOS Transistor 510. N-LDMOS Transistor 502 comprises Gate 504, Drain 506 and Source 508. The voltage present at N-gate 504 dictates the flow of current from Drain 506 to Source 508. P-LDMOS Transistor 510 comprises Gate 512, Source 514 and Drain 516. The voltage present at Gate 512 dictates the flow of current from Source 514 to Drain 516. Drain 506 of N-LDMOS Transistor 502 is coupled to Source 514 of P-LDMOS Transistor 510 to form Drain 520 of N-P-LDMOS device 500A. Likewise, Source 508 of N-LDMOS Transistor 502 is coupled to Drain 516 of P-LDMOS Transistor 510 to form Source 522 of N-P-LDMOS 500A. The total current flow from Drain 520 to Source 522 is $I_{DS\text{-}N}$+ $I_{SD\text{-}P}$, i.e., the sum of the drain-to-source current $I_{DS\text{-}N}$ of N-LDMOS Transistor 502 and the source-to-drain current $I_{SB\text{-}P}$ of P-LDMOS Transistor 510. It is clear from this figure that the N-P-LDMOS 500A has four terminals and requires two control signals for the gates. Because of this, the N-P-LDMOS circuit is not as convenient to use as the conventional three-terminal power devices. Moreover, since the reference node for PMOS Gate 512 is the high voltage Drain 520, the PMOS gate control signal voltage level, which is conventionally generated by the low voltage circuits in a PWM controller integrated circuit, needs to be shifted up to high voltage. The complexity of the dual gates driver circuit can heavily impact the benefits of the bimodal N-P-LDMOS, even to the extent of making use of the N-P-LDMOS futile.

State of the art implementations of an N-P-LDMOS device typically use an external diode and capacitor to generate the supply voltage for the PMOS driver, since this driver is implemented in the high voltage side of the device. This solution was based on Technology Computer Aided Design (TCAD) study, which did not address the concern of bipolar mode induced parasitic turn-on and minority carrier injection into the substrate. The necessary external components and the additional required high-voltage pins increase the cost of implementing the device. The use of external components can also add undesirable parasitic inductances and/or resistances within the high-voltage loop.

Figure 5B:
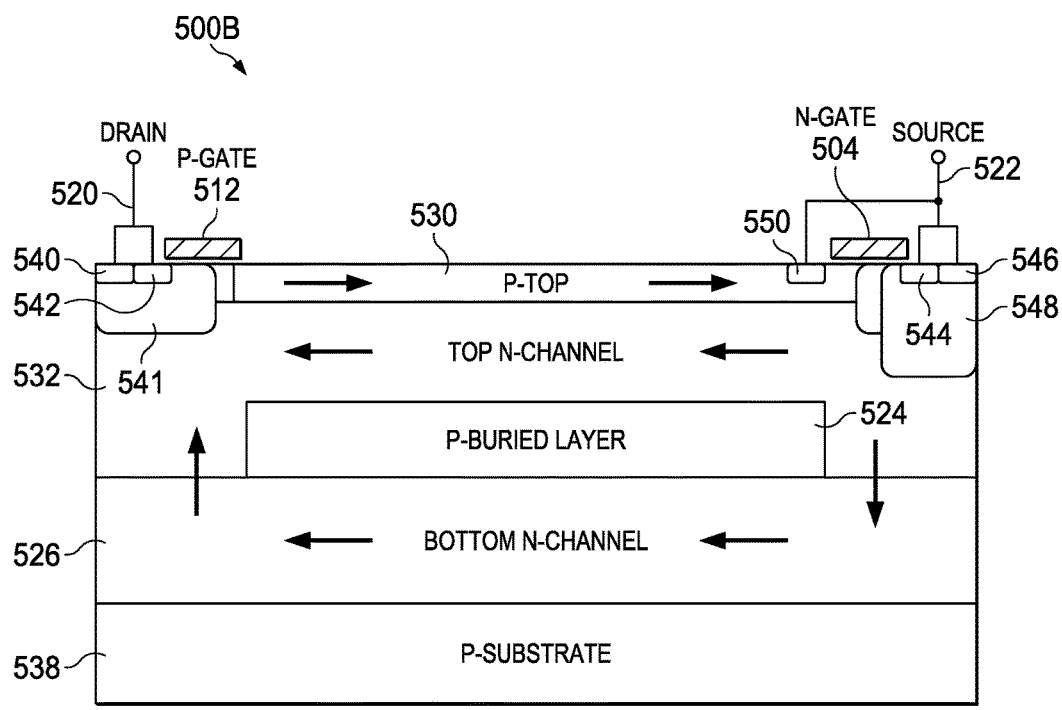
FIG. 5B depicts a cross-section of an example N-P-LDMOS circuit.

FIG. 5B depicts a cross-section of power transistor 500A. The LDMOS power transistor 500B includes an n-type region, Bottom N-Channel 526, which is formed over a p-type substrate 538, a buried p-type region, P-Buried Region 524, and a second n-type region, Top N-Channel 532. As used herein, a "p-type" region refers to a region that is positively doped, i.e., doped with a positive charge, while an "n-type" region refers to a region that is negatively doped, i.e., doped with a negative charge. A p-type region, P-Top 530, is formed on top of the Top N-Channel 532. Both P-Buried Region 524 and P-Top 530 function as Reduced Surface Fields (RESURF), which means they serve to reduce an electric field in their respective adjacent n-type regions, Bottom N-Channel 526 and Top N-Channel 532.

A drain electrode 520 is electrically coupled to both a highly negatively doped (n+) implant 540 and a highly positively doped (p+) implant 542, the latter of which serves as the source of the PMOS transistor that is embedded in the power transistor 500B. Both implants 540 and 542 are embedded in an n-type Well 541. A source electrode 522 is electrically coupled to a highly negatively doped (n+) implant 544 and to a highly positively doped (p+) implant 546, both of which are embedded in a p-type Well 548 within the n-type region 532. The source electrode 522 is also electrically coupled to a highly positively doped (p+) implant 550, which forms the drain of the PMOS transistor that is embedded in the power device 500B. Implant 550 is embedded in the top p-type region 530 that serves as a drain extension of the PMOS. Arrows in P-Top 530 illustrate the current flow, in the form of holes, for the PMOS device, while the arrows in Top N-Channel 532 and Bottom N-Channel 526 illustrate the current, in the form of electrons, for the NMOS device; together these demonstrate the bimodal conduction of this device that provides an advantage in lower resistance. However, as mentioned previously, implementation of the control circuit for the N-P-LDMOS device is critical to the overall efficiency of the device.

Figure 1:
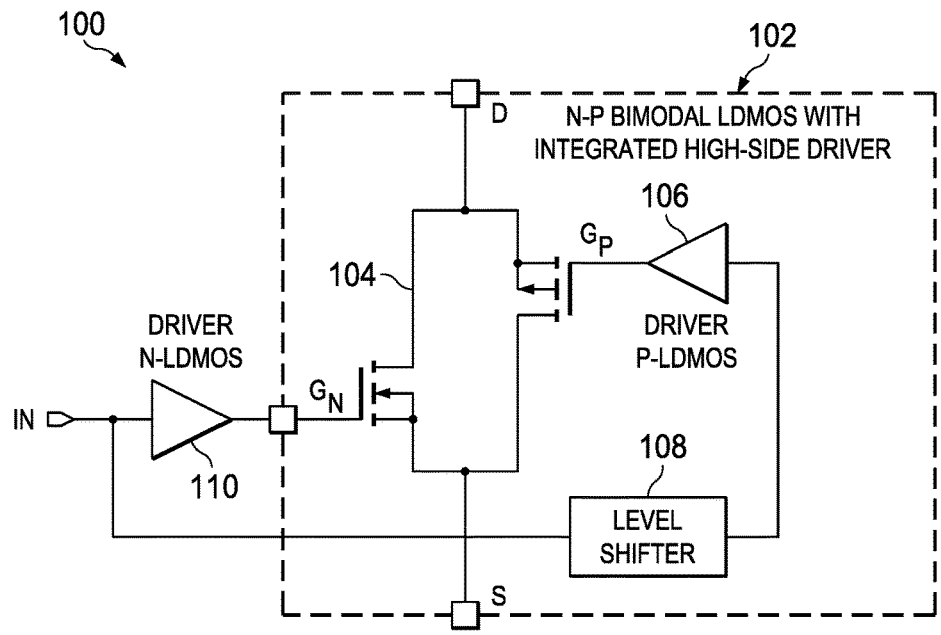
FIG. 1 depicts an example of a bimodal N-P-LDMOS device and control circuitry therefor according to an embodiment of the disclosure.

Referring now to FIG. 1, a control circuit according to an embodiment of the disclosure is shown. Circuit 100 includes N-P-LDMOS Circuit 104 and receives a low-voltage input signal at Node IN. The control circuitry includes Driver 110, which drives N-gate $G_N$ of N-P-LDMOS Transistor 104, Driver 106, which drives P-gate $G_P$ of N-P-LDMOS Transistor 104, and Level Shifter 108, which receives the low-voltage input signal IN and provides a high-voltage control signal to P-gate Driver 106. Both P-gate Driver 106 and Level Shifter 108 are integrated into Chip 102 in which bipolar N-P-LDMOS Circuit 104 is formed. Integration of these components into the chip allows for shorter connections between the components, which in turn, can provide faster operation.

Because the reference node for N-gate $G_N$ is the low voltage Source S, the low-voltage signal received at IN can be used to drive N-gate $G_N$. However as noted above, the reference note for P-gate $G_P$ is the high-voltage Drain D, so that driving P-gate $G_P$ requires that the input signal be shifted to a high voltage. This is done at Level Shifter 108, which shifts the low-voltage input signal IN, which can be, e.g., 3-5 V, to a high-voltage signal at, e.g., 700 V.

Figure 2A:
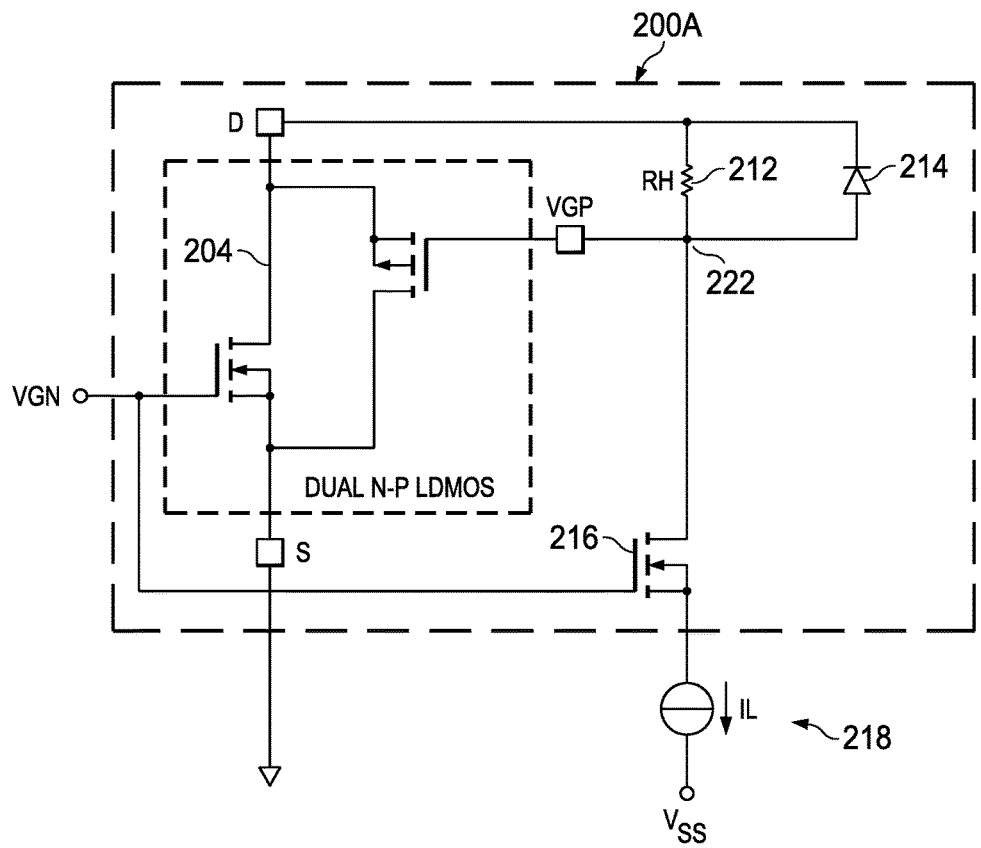
FIG. 2A depicts an implementation of the bimodal N-P-LDMOS device and control circuit of FIG. 1 according to an embodiment of the disclosure.

FIG. 2A discloses a specific implementation of the circuit of FIG. 1 on chip 200A. It will be understood that the disclosed embodiment is for example only and not for limitation. In this embodiment, PMOS Driver 106 is implemented as Resistor 212 and Diode 214; Level Shifter 108 is implemented as N-LDMOS Transistor 216. Each of Resistor 212, Diode 214 and N-LDMOS Transistor 216 is integrated into Chip 200A, which contains Bimodal N-P-LDMOS 204. Current source 218 is coupled between the source of N-LDMOS Transistor 216 and $V_{SS}$. As shown in this embodiment, current source 218 is not integrated into chip 200A. However, in at least one embodiment, current source 218 is integrated into chip 200A. In at least one embodiment $V_{SS}$ is local ground. In at least one embodiment, $V_{SS}$ is a voltage that is lower than local ground and thus provides a negative voltage. The advantage of the latter embodiment is explained with regard to FIG. 3 below. When no input signal is received, the P-gate of N-P-LDMOS Transistor 204 is pulled towards the upper rail since the source and gate of the PMOS are coupled, so that the P-gate is turned off. Once an input signal is received, this signal turns on N-LDMOS 216, which begins pulling the P-gate $G_P$ towards $V_{SS}$, turning on the P-gate of N-P-LDMOS Transistor 204.

Figure 2B:
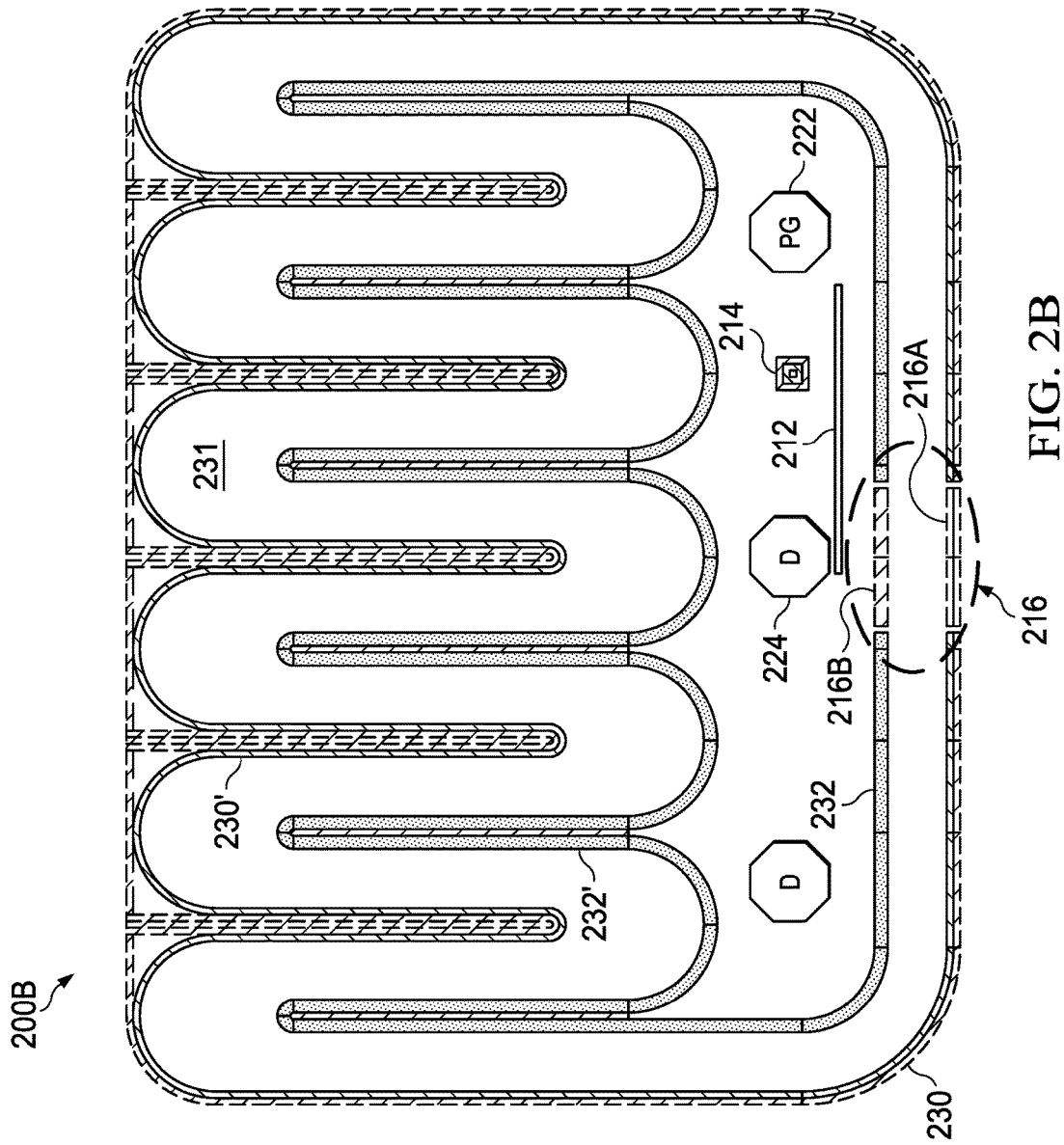
FIG. 2B discloses a plan view of the N-P-LDMOS chip, illustrating how the control circuit of FIG. 2A is integrated into the layout of the chip containing the N-P-LDMOS.

FIG. 2B is a plan view of the circuit of FIG. 2A in which Resistor 212, Diode 214 and NMOS Transistor 216 are integrated into Chip 200B. In this figure, two loops are seen, each forming "fingers" that extend either from the top or the bottom of the drawing. The outer loop is Source/N-gate 230, which forms fingers 230' that extend inward from the outer loop. This loop corresponds to Source 522 and N-gate 504 in FIG. 5B and represents the low voltage side of the power device. Similarly, the inner loop is Drain/P-gate 232, which is enclosed within the outer loop and which forms fingers 232' that extend outward from the inner loop. This inner loop corresponds to Drain 520 and P-gate 512 in FIG. 5B and encloses the high-voltage side of the power device. Region 231, which lies between Source/N-gate 230 and Drain/P-gate 232, includes the conduction regions represented by in FIG. 5B by Bottom N-Channel 526, Top N-Channel 532 and P-Top 530. The hexagonal regions shown include P-gate Pad 222 and Drain Bond Pads 224. Resistor 212 is a polysilicon strip that extends between Drain Pad 224 and P-gate Pad 222, with Diode 214 also located between these two pads. Source/N-Gate 230 and Drain/P-Gate 232 do not form closed loops; rather each contains a gap, located opposite the "fingers", with N-LDMOS Transistor 216 formed in the gap. The two pieces of N-LDMOS Transistor 216, i.e., source/n-gate 216A and drain 216B, are isolated from Source/N-gate 230 and from Drain/P-gate 232, but are formed at the same time as the main N-P-LDMOS. N-LDMOS 216 is embedded in the layout of Bimodal N-P-LDMOS 204 while it is isolated from the bimodal LDMOS by a certain voltage, which in one embodiment is 20 V. The gap between the drain of level shifting N-LDMOS 216 and Drain D of Bimodal N-P-LDMOS 204 sets this voltage, which allows Diode 214 and Resistor 212 to operate correctly, as the two drains would otherwise be shorted by the drain's n-type Well 541. P-gate Pad 222 in this figure corresponds to Node 222 of FIG. 2A, which is coupled to each of the P-gate of LDMOS 204, Resistor 212, Diode 214 and the drain of N-LDMOS transistor 216. Accordingly, metal connections (not specifically shown) will couple P-gate Pad 222 to each of these elements as shown in the plan view. It will be clear that the integration of these elements into Chip 200B occupies very little space on the chip and does not require any additional processing steps. Integration of the level-shifter and P-gate driver into Chip 200B may also provide the convenience of treating this four-terminal device like a three-terminal device. It was previously mentioned that Current Source 218 can also be integrated into Chip 200B. Although not shown herein, the current source would, of course, be integrated into the low-voltage side of the chip.

Figure 2C:
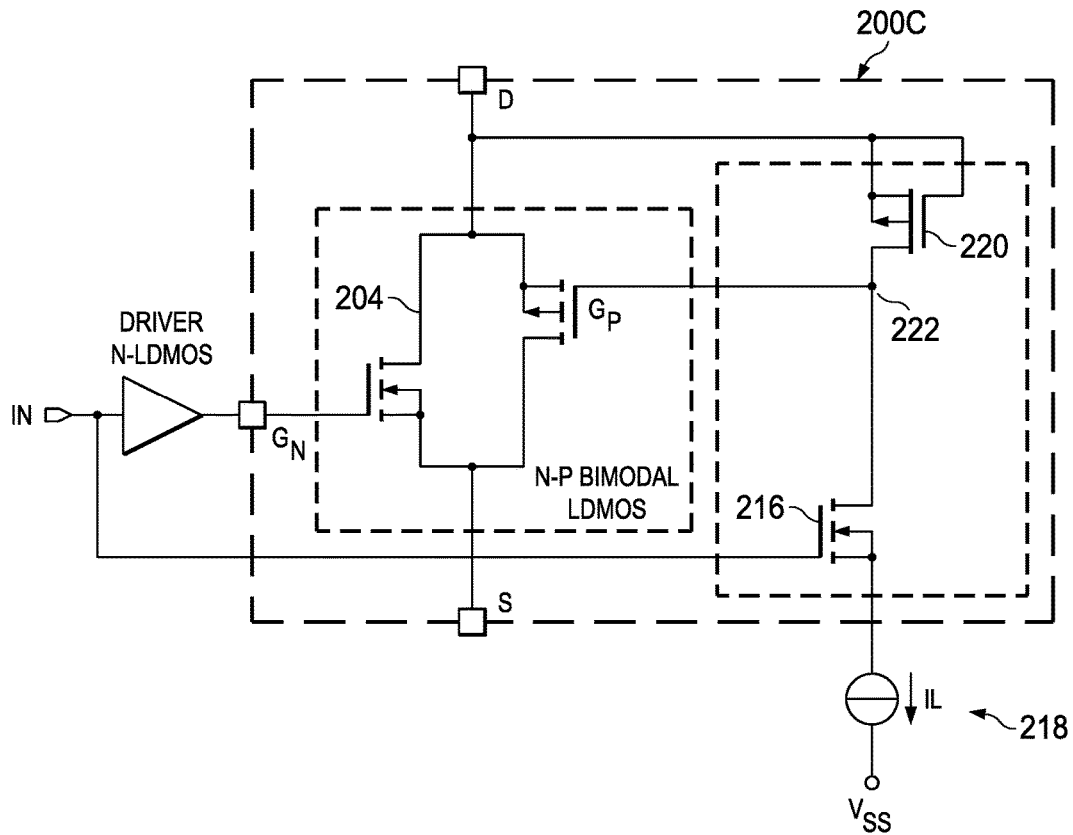
FIG. 2C depicts an implementation of the bimodal N-P-LDMOS device and control circuit of FIG. 1 according to an embodiment of the disclosure.

FIG. 2C discloses another implementation of the circuit of FIG. 1 on chip 200C. In this embodiment, the PMOS Driver is implemented as depletion-mode low voltage PMOS transistor 220, which has both source and gate coupled to the high voltage rail and a drain coupled to the drain of N-LDMOS transistor 216. This configuration provides a more efficient P-channel driver. The level shifter is again implemented as N-LDMOS Transistor 216 and Current Source 218 is again coupled between the source of N-LDMOS Transistor 216 and $V_{SS}$. Since PMOS 220 is a depletion-mode transistor and the source and gate of PMOS 220 are both coupled to the high voltage rail, PMOS 220 is normally on, pulling the P-gate of Bimodal-N-P-LDMOS 204 high and keeping the P-gate turned off. When N-LDMOS Transistor 216 is turned on by the input signal, the P-gate of Bimodal-N-P-LDMOS 204 is pulled toward $V_{SS}$, turning the P-gate on. When depletion-mode PMOS 220 is integrated into the chip, PMOS 220 is contained by the drain Well 541 in FIG. 5B; this n-well can serve as the body of PMOS 220.

Figure 3:
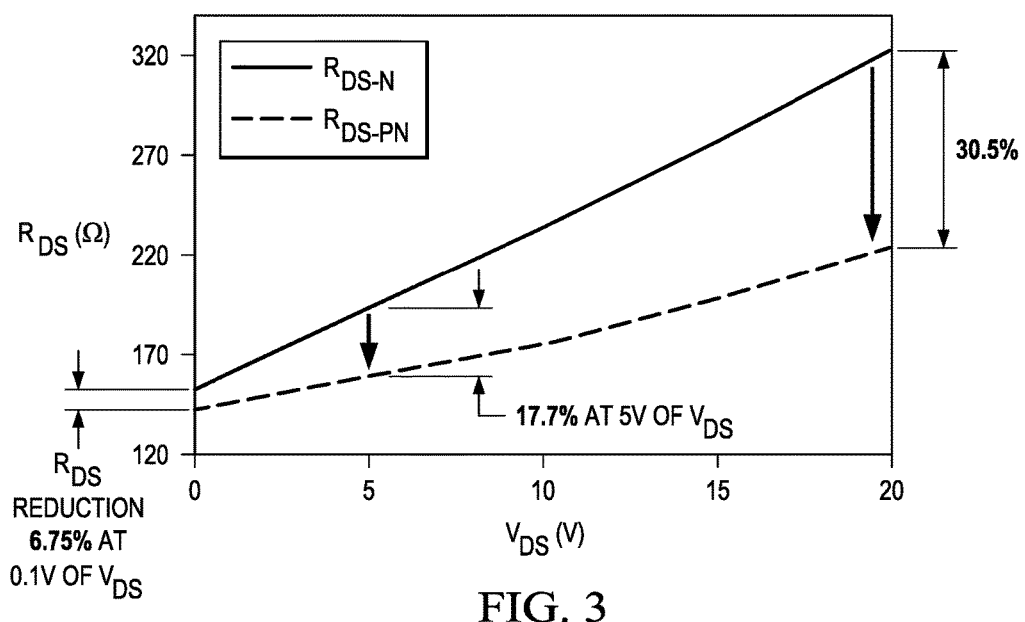
FIG. 3 depicts the drain-source resistance versus drain-source voltage of the circuit of FIG. 2A.

FIG. 3 illustrates the drain-source resistance $R_{DS}$ versus drain-source voltage $V_{DS}$ for N-P-LDMOS 204 of FIG. 2A when driven strictly as an N-LDMOS versus driven as an N-P-LDMOS. $R_{DS}$ provides an indication of how efficient the device is, with a lower $R_{DS}$ indicating less conduction losses. Using a probe station, only the N-gate of bimodal N-P-LDMOS transistor 204 was driven to produce the upper line, $R_{DS-N}$, while the P-gate was turned off by shorting the P-gate to the drain. The lower line, $R_{DS-PN}$, was produced in a similar manner using a probe station to simultaneously turn on both the N-gate and the P-gate. Notably, when both the N-gate and the P-gate are turned on, providing bi-modal conduction, the resistance across the device is noticeably less than when only the N-gate is turned on. As shown in this figure, there is a 6.75 percent reduction in $R_{DS}$ at 0.1 volts, a 17.7 percent reduction at 5 volts, and a 30.5 percent reduction at 20 volts. In early testing using a PMOS portion of the N-P-LDMOS transistor that has a threshold voltage of 0.7 V, the drain-source resistance of the N-P-LDMOS circuit was shown to initially follow the higher N-gate-only curve until the threshold voltage was reached and then the drain-source resistance would drop to follow the lower curve. However, Applicants determined that by setting $V_{SS}$ to a negative voltage, e.g., −1V, the curve for the N-P-LDMOS that is driven by a single signal using the disclosed circuit will duplicate the curve of $R_{DS-PN}$, thus confirming a reduction in $R_{DS}$ with the use of the internal circuit. The benefit of the two-gate bimodal conduction is reached using only a single input signal to the N-P-LDMOS device.

Figure 4:
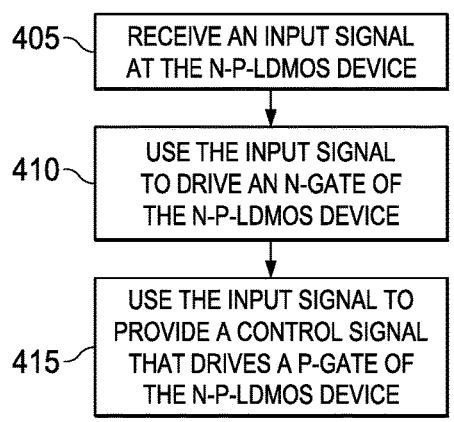
FIG. 4 depicts a method of operating an N-P-LDMOS power transistor.

FIG. 4 discloses a method of operating an N-P-LDMOS device as shown. The method starts by receiving (405) an input signal at the N-P-LDMOS device. The N-P-LDMOS device uses (410) the input signal to drive an N-gate of the N-P-LDMOS device. The N-P-LDMOS device also uses (415) the input signal to provide a control signal that drives a P-gate of the N-P-LDMOS device.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. For example, although the disclosed embodiments utilize specific types of transistors, one skilled in the art will recognize that the level shifting circuit may be implemented to achieve functional equivalence for controlling the P-gate in further embodiments, which may be realized in suitable transistors, e.g., MOSFET, JFET, BJT, and the like. Accordingly, those skilled in the art will recognize that the exemplary embodiments described herein can be practiced with various modifications and alterations within the spirit and scope of the claims appended below.

What is claimed is:

1. An integrated circuit comprising:
    a circuit input, a circuit drain, and a circuit source;
    a bimodal power N-P-Laterally Diffused Metal Oxide Semiconductor (N-P-LDMOS) device having a NMOS transistor, a PMOS transistor, and a drain bond pad region, the NMOS transistor having a gate, a drain, and a source, the PMOS transistor having a gate, a drain, and a source, the gate of the NMOS transistor being coupled to the circuit input, the drain of the NMOS being coupled to the circuit drain and the source of the PMOS transistor, and the source of the NMOS transistor being coupled to the circuit source and the drain of the PMOS transistor;
    a level shifter having an input coupled to the circuit input and an output, the level shifter including an N LDMOS transistor having a gate coupled to the circuit input, having a drain, and having a source;
    a P-gate driver having an input coupled to the output of the level shifter and having an output coupled to the gate of the PMOS transistor, the P-gate driver being integrated in the drain bond pad region.

2. The integrated circuit of claim 1 in which the P-gate driver includes a resistor coupled between the drain of the N LDMOS transistor and the circuit drain of the N-P-LDMOS device and includes a diode coupled between the drain of the N LDMOS transistor and the circuit drain of the N-P-LDMOS device.

3. The integrated circuit of claim 2 in which the gate of the PMOS transistor is coupled to between the resistor and the N LDMOS transistor.

4. The integrated circuit of claim 3 including a current source coupled between the source of the N-LDMOS transistor and a voltage VSS.

5. The integrated circuit of claim 4 in which the current source is separate from the integrated circuit.

6. The integrated circuit of claim 4 in which the voltage VSS is a negative voltage.

7. The integrated circuit of claim 3 in which the N LDMOS transistor is embedded in the bimodal power N-P-LDMOS device and isolated from the bimodal power N-P-LDMOS device by a given voltage.

8. The integrated circuit of claim 7 in which the given voltage is 20 volts.

9. An integrated circuit comprising:
    a gate terminal;
    a drain terminal;
    a source terminal;
    a bimodal power N-P-Laterally Diffused Metal Oxide Semiconductor (LDMOS) device having an N-gate and a P-gate, the N-P-LDMOS device being coupled between the drain terminal and the source terminal and the N-gate of the N-P-LDMOS device being coupled to the gate terminal;
    a level shifter including an N-LDMOS transistor having a gate coupled to the gate terminal, having a drain, and having a source;
    a P-gate driver coupled between the N-LDMOS transistor and the P-gate; and
    an N-gate driver coupled between the gate terminal and the N-gate.

10. The integrated circuit of claim 9, in which the N-P-LDMOS device includes a NMOS transistor and a PMOS transistor, the NMOS transistor having a drain and a source and the PMOS transistor having a drain and a source, the drain terminal is coupled to the drain of the NMOS transistor and the source of the PMOS transistor, and the source terminal is coupled to the source of the NMOS transistor and the drain of the PMOS transistor.

11. The integrated circuit of claim 9, in which the P-gate driver is integrated in a drain bond pad region of the N-P-LDMOS device.

12. The integrated circuit of claim 9, wherein the P-gate driver includes a resistor, having first and second terminals, coupled between the drain terminal and the drain of the N-LDMOS transistor, and a diode coupled between the first and second terminals of the resistor.

13. The integrated circuit of claim 12, in which the N-LDMOS transistor is embedded in the bimodal power N-P-LDMOS device and isolated from the bimodal power N-P-LDMOS device by a given voltage.

14. The integrated circuit of claim 13, in which the given voltage is 20 volts.

15. The integrated circuit of claim 12, in which the P-gate is coupled to between the resistor and the N LDMOS transistor.

* * * * *